(12) United States Patent
Nakajima

(10) Patent No.: US 8,227,784 B2
(45) Date of Patent: Jul. 24, 2012

(54) SEMICONDUCTOR MEMORY DEVICE INCLUDING RESISTANCE-CHANGE MEMORY

(75) Inventor: Hiroomi Nakajima, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 137 days.

(21) Appl. No.: 12/823,611

(22) Filed: Jun. 25, 2010

(65) Prior Publication Data

US 2011/0068315 A1  Mar. 24, 2011

(30) Foreign Application Priority Data

Sep. 18, 2009 (JP) ................................. 2009-217886

(51) Int. Cl.
*H01L 29/02* (2006.01)

(52) U.S. Cl. .. 257/2; 257/3; 257/4; 257/5; 257/E29.002; 438/102; 438/103

(58) Field of Classification Search ................. 257/2–5, 257/E29.002; 438/102–103
See application file for complete search history.

(56) References Cited

U.S. PATENT DOCUMENTS

| | | | |
|---|---|---|---|
| 6,034,882 | A | 3/2000 | Johnson |
| 2007/0132049 | A1 | 6/2007 | Stipe |
| 2008/0258129 | A1 | 10/2008 | Toda |
| 2010/0237313 | A1* | 9/2010 | Mikawa et al. ................... 257/2 |

FOREIGN PATENT DOCUMENTS

| | | |
|---|---|---|
| JP | 2003-318413 | 11/2003 |
| JP | 2005-522045 | 7/2005 |

OTHER PUBLICATIONS

U.S. Appl. No. 12/556,005, filed Sep. 9, 2009, Hiroshi Kanno, et al.

* cited by examiner

*Primary Examiner* — Jami M Valentine
(74) *Attorney, Agent, or Firm* — Oblon, Spivak, McClelland, Maier & Neustadt, L.L.P.

(57) ABSTRACT

A semiconductor memory device includes first lines and second lines and a memory cell array. The first lines and second lines are formed to intersect each other. The memory cell array includes memory cells arranged at intersections of the first lines and the second lines and each formed by connecting a rectification element and a variable-resistance element in series. The rectification element includes a first semiconductor region having an n-type and a second semiconductor region having a p-type. At least a portion of the first semiconductor region is made of a silicon-carbide mixture ($Si_{1-x}C_x$ ($0<x<1$)), and the second semiconductor region is made of silicon (Si).

11 Claims, 8 Drawing Sheets

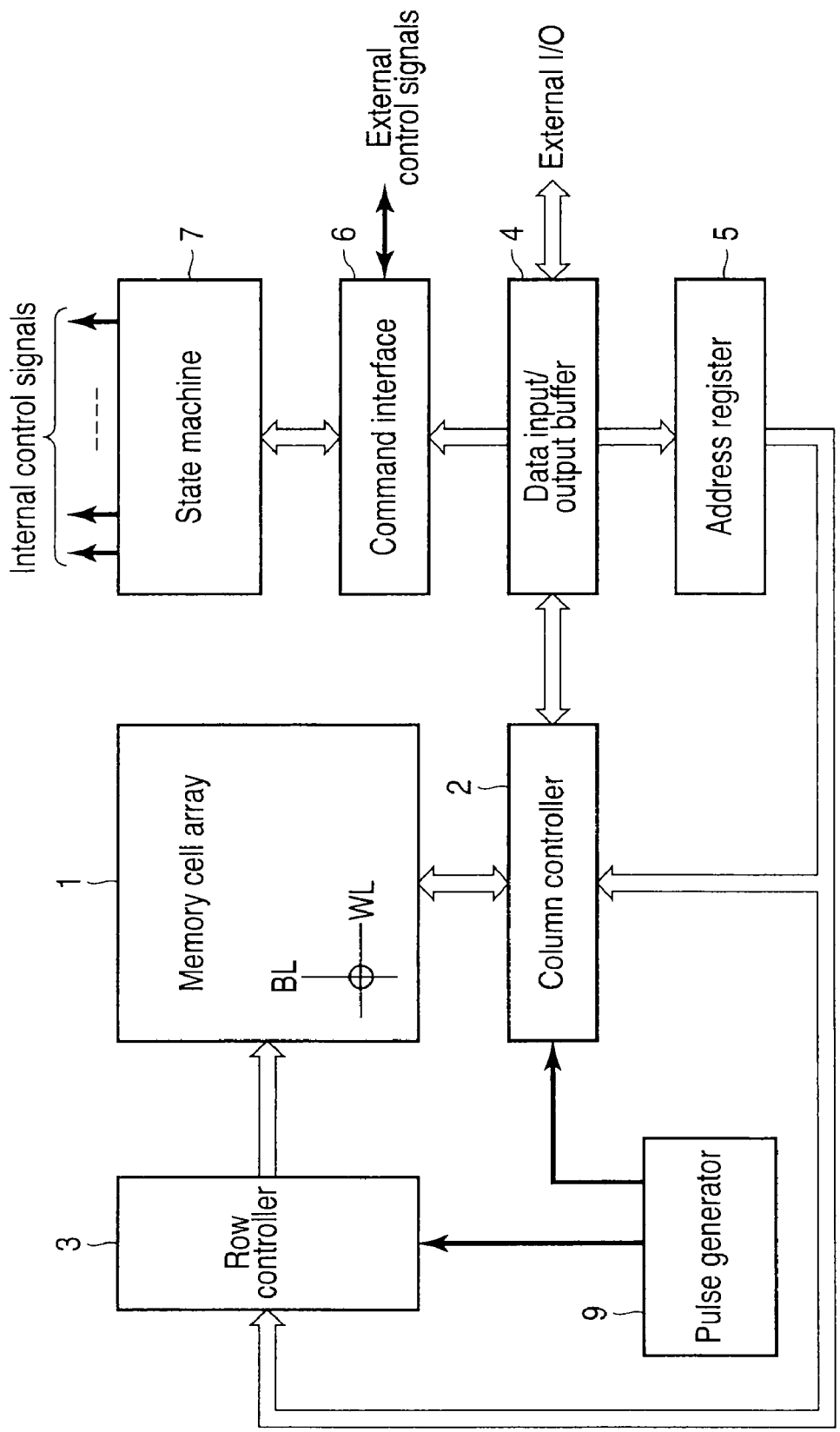
F I G. 1

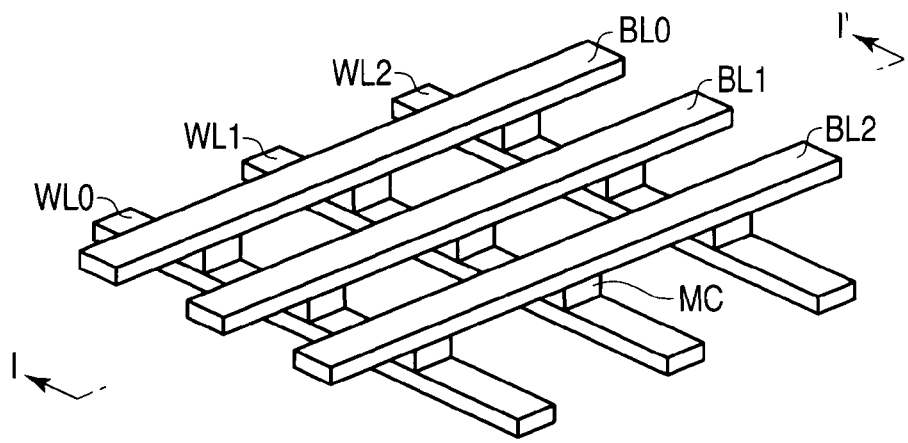
F I G. 2
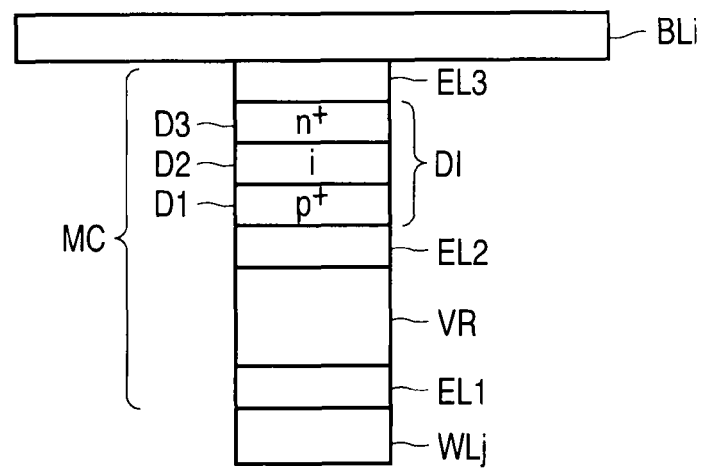
F I G. 3

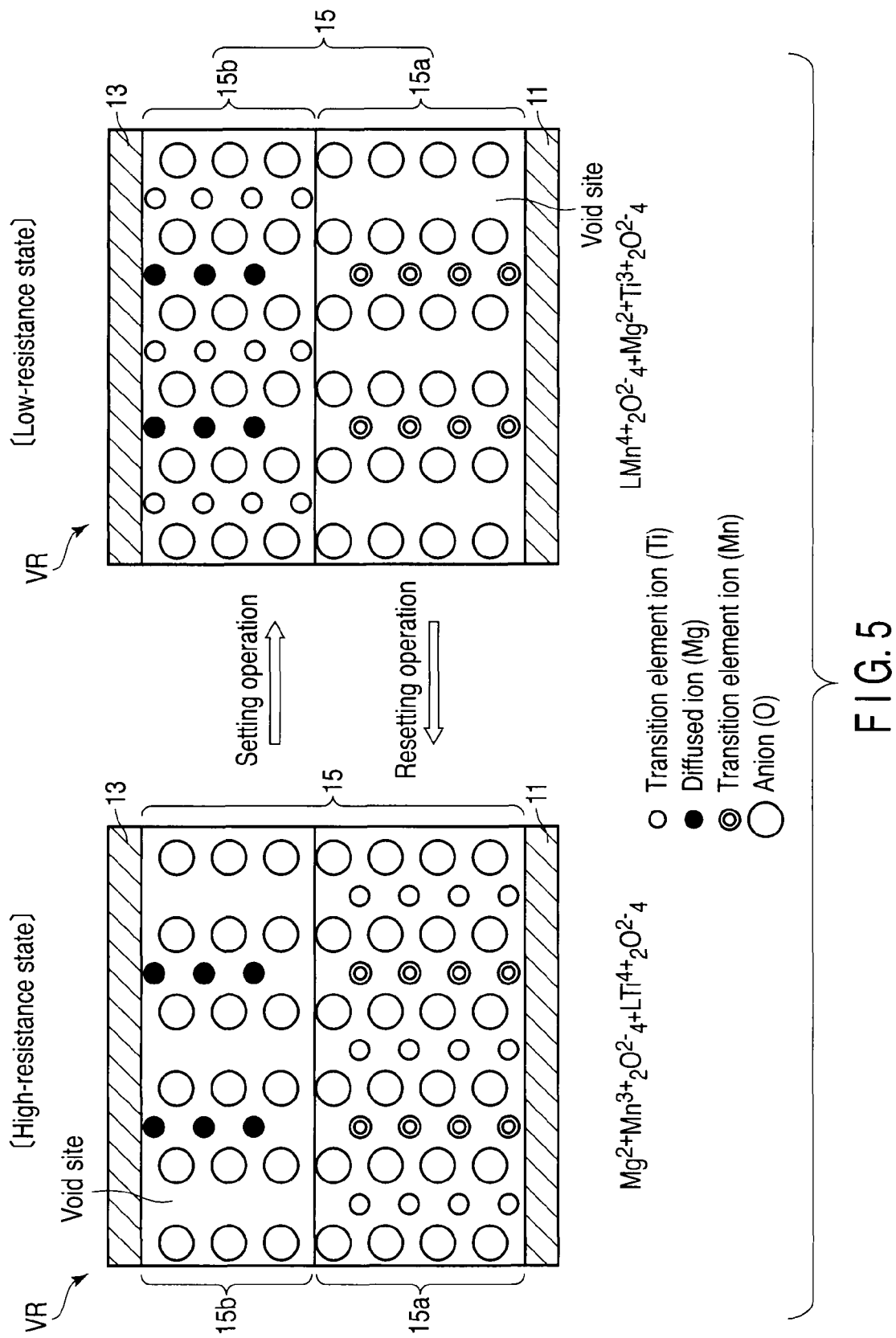
F I G. 5

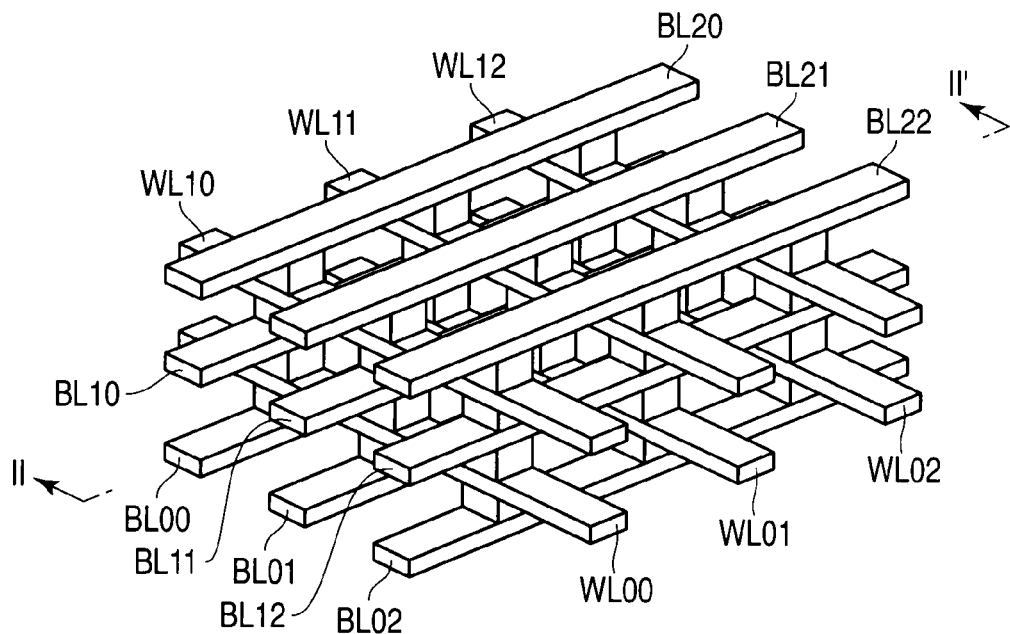
F I G. 6
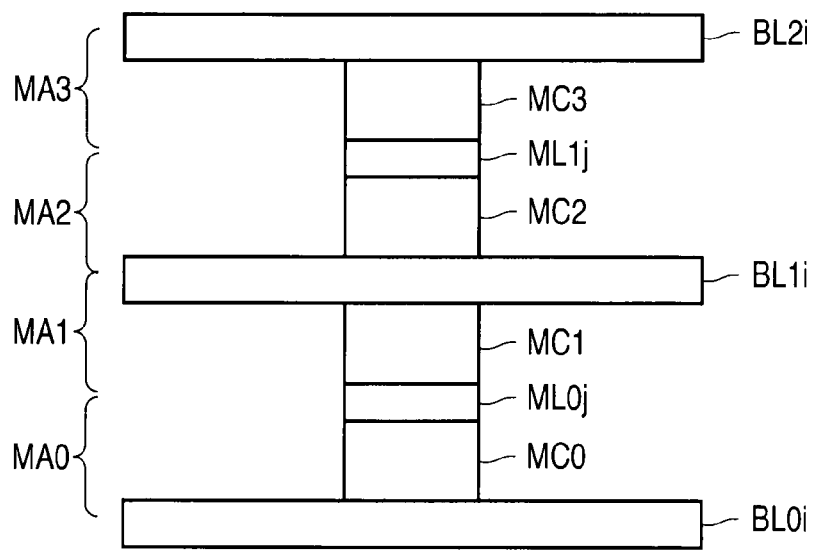
F I G. 7

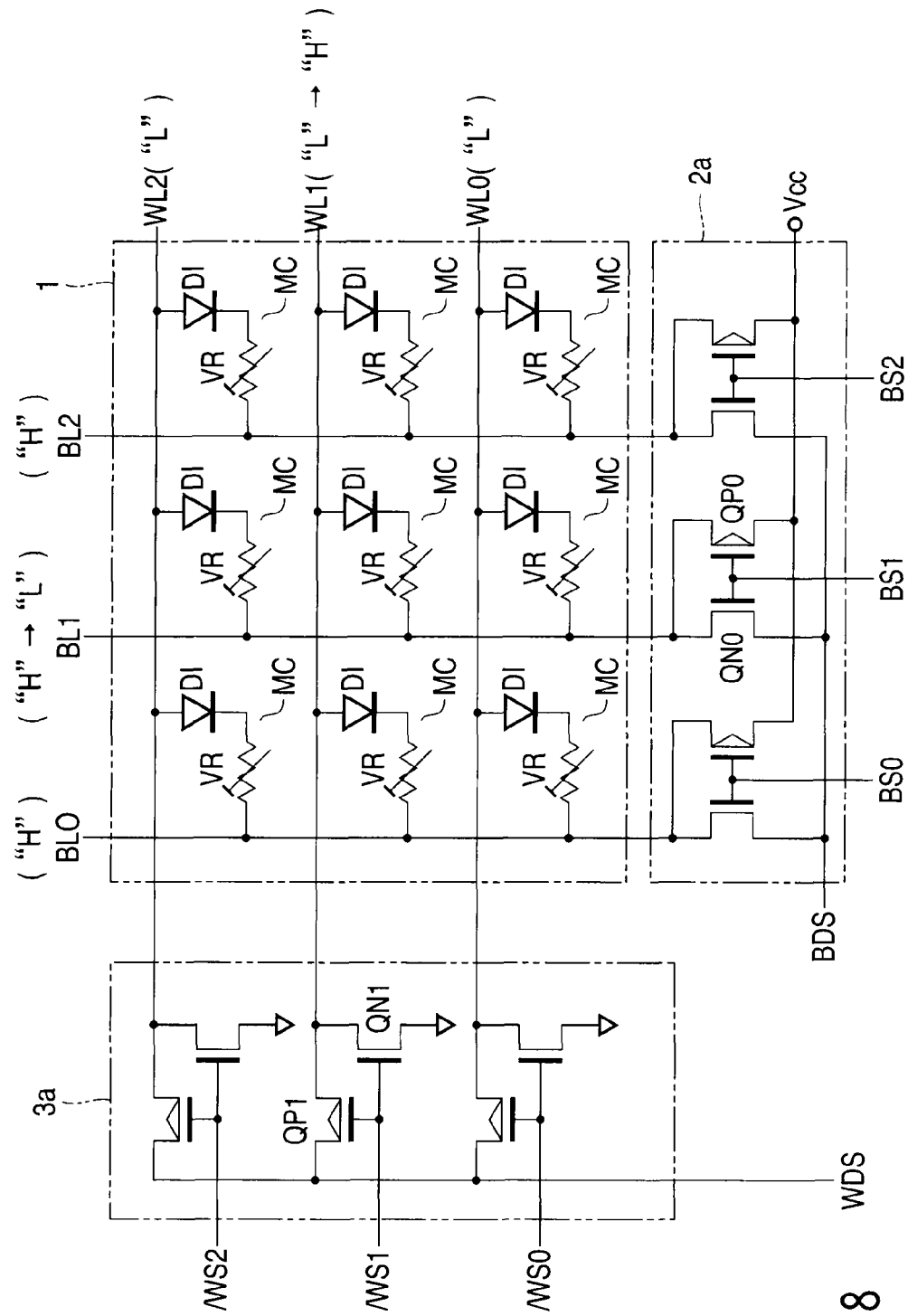
F I G. 8

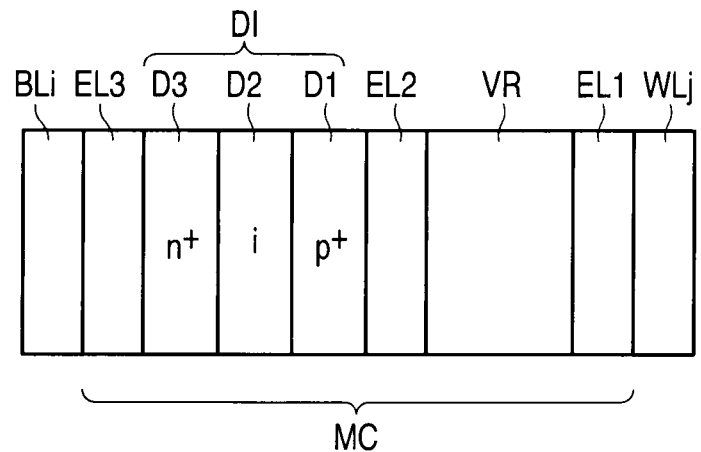
F I G. 9
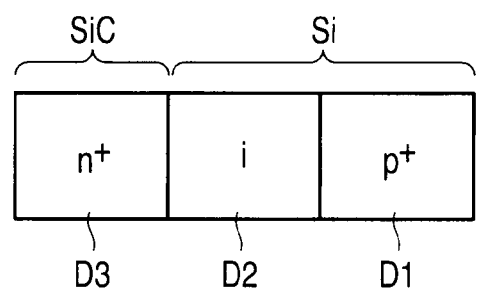
F I G. 10
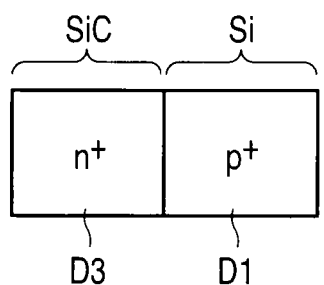
F I G. 11

US 8,227,784 B2

SEMICONDUCTOR MEMORY DEVICE INCLUDING RESISTANCE-CHANGE MEMORY

CROSS-REFERENCE TO RELATED APPLICATIONS

This application is based upon and claims the benefit of priority from prior Japanese Patent Application No. 2009-217886, filed Sep. 18, 2009, the entire contents of which are incorporated herein by reference.

BACKGROUND OF THE INVENTION

1. Field of the Invention

The present invention relates to a semiconductor memory device, e.g., a resistance-change memory including a memory cell formed by connecting a diode and variable-resistance element in series.

2. Description of the Related Art

Conventionally known, commercially available semiconductor memory devices such as a DRAM, SRAM, and flash memory use a MOSFET as a memory cell. As the speed of shrinking increases, therefore, it is becoming increase the dimensional accuracy at a ratio higher than that of shrinking. Accordingly, a large load is imposed on the lithography technique for forming these patterns, and this raises the manufacturing cost.

Recently, a resistance-change memory is attracting attention as a candidate for succeeding a semiconductor memory device using a MOSFET as a memory cell as described above (see, e.g., Jpn. PCT National Publication No. 2005-522045). The resistance-change memory herein mentioned includes a resistance-change memory in a narrow sense (resistive RAM [ReRAM]) that contains a transition metal oxide as a recording layer and stores the resistance state of the recording layer in a nonvolatile manner, and a phase-change memory (phase-change RAM [PCRAM]) that contains chalcogenide or the like as a recording layer and uses resistance information of a crystalline state (conductor) and amorphous state (insulator) of the recording layer.

A variable-resistance element of the resistance-change memory has two kinds of forms. One is called a bipolar element by which a high- or low-resistance state is set by switching the polarities of an application voltage. The other is called a unipolar element by which the high- and low-resistance states can be set by controlling the voltage and voltage application time without switching the polarities of an application voltage.

The unipolar element is favorable to implement a high-density memory cell array. Because in case of using the unipolar element, a cell array can be formed by overlaying a variable-resistance element and a rectification element such as a diode at the intersection of a bit line and word line, without using any transistor. In addition, in case memory cell arrays like this are three-dimensionally stacked, a large capacity can be achieved without increasing the cell array area because transistor is not included in memory cell.

In the unipolar ReRAM, data is programmed in a memory cell by applying a predetermined voltage to the variable-resistance element for a short time. This changes the variable-resistance element from the high-resistance state to the low-resistance state. This operation of changing the variable-resistance element from the high-resistance state to the low-resistance state will be called a setting operation hereinafter.

On the other hand, data is erased from a memory cell by applying, for a long time, a predetermined voltage lower than that of the setting operation to the variable-resistance element in the low-resistance state after the setting operation. This changes the variable-resistance element from the low-resistance state to the high-resistance state. This operation of changing the variable-resistance element from the low-resistance state to the high-resistance state will be called a resetting operation hereinafter. The high-resistance state of a memory cell is, e.g., a stable state (reset state). In case of storing binary data, the data is programmed by the setting operation of changing the reset state to the low-resistance state.

In the resetting operation, a large current is supplied as a reset current to a memory cell. Therefore, the diode to be connected in series with the variable-resistance element should output a large current. When using a simple p-n junction diode as the diode, however, excess voltage can not be applied to an unselected variable-resistance element. That is, the junction breakdown occurs in the p-n junction of diode. This limits the output current.

BRIEF SUMMARY OF THE INVENTION

According to a first aspect of the present invention, there is provided a semiconductor memory device comprising: first lines and second lines formed to intersect each other; and a memory cell array comprising memory cells arranged at intersections of the first lines and the second lines and each formed by connecting a rectification element and a variable-resistance element in series, the rectification element comprising a first semiconductor region having an n-type and a second semiconductor region having a p-type, wherein at least a portion of the first semiconductor region is made of a silicon-carbide mixture ($Si_{1-x}C_x$ ($0<x<1$)), and the second semiconductor region is made of silicon (Si).

BRIEF DESCRIPTION OF THE SEVERAL VIEWS OF THE DRAWING

FIG. 1 is a block diagram showing the arrangement of a resistance-change memory of an embodiment of the present invention;

FIG. 2 is a perspective view showing a part of a memory cell array according to the embodiment;

FIG. 3 is a sectional view of a memory cell taken along line I-I' in FIG. 2;

FIG. 5 is a view showing examples of the high- and low-resistance states of the variable-resistance element according to the embodiment;

FIG. 6 is a perspective view showing a part of a modification of the memory cell array according to the embodiment;

FIG. 7 is a sectional view of a memory cell taken along line II-II' in FIG. 6;

FIG. 8 is a circuit diagram showing the memory cell array and its peripheral circuit according to the embodiment;

FIG. 9 is a sectional view showing the structure of the memory cell according to the embodiment;

FIG. 10 is a sectional view showing the structure of a diode according to the embodiment;

FIG. 11 is a sectional view showing the structure of a modification of the diode according to the embodiment;

DETAILED DESCRIPTION OF THE INVENTION

Figure 4:
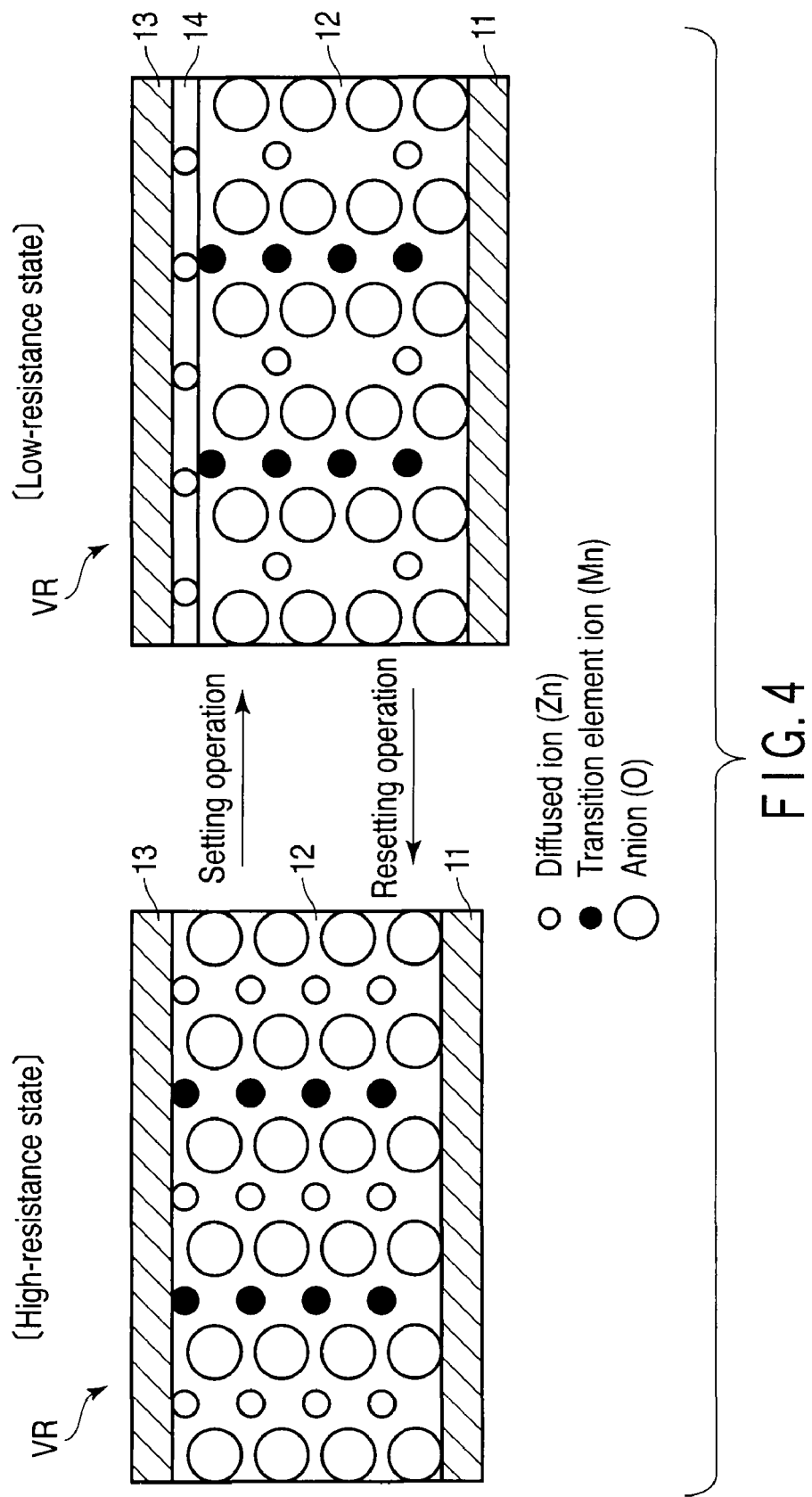
FIG. 4 is a view showing examples of the high- and low-resistance states of a variable-resistance element according to the embodiment.

An embodiment of the present invention will be explained below with reference to the accompanying drawing. In the following explanation, the same reference numerals denote the same parts throughout the drawing.

[1] Overall Configuration of Resistance-Change Memory of Embodiment

FIG. 1 is a block diagram showing the arrangement of a resistance-change memory according to the embodiment of the present invention.

This resistance-change memory includes a memory cell array 1 in which memory cells are arranged in a matrix. Each memory cell includes a ReRAM (variable-resistance element) (to be described later), and a rectification element such as a diode.

A column controller 2 is formed in a position adjacent to the memory cell array 1 in the direction of a bit line BL. The column controller 2 controls the bit line BL of the memory cell array 1, thereby performing data erase, data write, and data read with respect to a memory cell.

Also, a row controller 3 is formed in a position adjacent to the memory cell array 1 in the direction of a word line WL. The row controller 3 selects a word line WL of the memory cell array 1, and applies voltages necessary for data erase, data write, and data read with respect to a memory cell.

A data input/output buffer 4 is connected to an external host apparatus (not shown) via an input/output (I/O) line. The data input/output buffer 4 receives write data, receives an erase instruction, outputs readout data, and receives address data and command data. The data input/output buffer 4 transfers the received write data to the column controller 2. Also, the input/output buffer 4 receives readout data from the column controller 2, and outputs the data to the external apparatus. An address supplied from the external apparatus to the data input/output buffer 4 is transferred to the column controller 2 and row controller 3 via an address register 5.

A command supplied from the host apparatus to the data input/output buffer 4 is transferred to a command interface 6. The command interface 6 receives an external control signal from the host apparatus, and determines whether the data input to the data input/output buffer 4 is write data, a command, or an address. If the input data is a command, the command interface 6 transfers the command as a received command signal to a state machine 7.

The state machine 7 manages the whole resistance-change memory. The state machine 7 receives commands from the host apparatus, and manages read, write, erase, data input/output, and the like. Also, the external host apparatus can confirm the operation result by receiving status information managed by the state machine 7. This status information is used in the control of write and erase as well.

Furthermore, the state machine 7 controls a pulse generator 8. This control enables the pulse generator 8 to output a pulse having an arbitrary voltage at an arbitrary timing. The formed pulse can be transferred to given lines selected by the column controller 2 and row controller 3.

Note that peripheral circuit elements other than the memory cell array 1 can be formed on a silicon substrate immediately below the memory cell array 1 formed in an interconnection layer. This makes the chip area of this resistance-change memory almost equal to the area of the memory cell array 1.

[1-1] Memory Cell Array

FIG. 2 is a perspective view of a part of the memory cell array 1. FIG. 3 is a sectional view of a memory cell taken along line I-I' in FIG. 2 and viewed in the direction of the arrows.

Word lines WL0 to WL2 run parallel as a plurality of first lines, and bit lines BL0 to BL2 run parallel as a plurality of second lines intersecting the first lines. Memory cells MC are arranged at the intersections of the word lines WL0 to WL2 and bit lines BL0 to BL2 so as to be sandwiched between them. The first and second lines are desirably made of a material that is strong against heat and has a low resistance. It is possible to use, e.g., W, WSi, NiSi, or CoSi.

[1-2] Memory Cell MC

As shown in FIG. 3, the memory cell MC is a circuit in which a variable-resistance element VR and diode DI are connected in series. When a voltage is applied, the variable-resistance element VR can change the resistance via, e.g., a current, heat, or chemical energy. Electrodes EL1, EL2, and EL3 functioning as a barrier metal and adhesive layer are arranged above and below the variable-resistance element VR and diode DI. The variable-resistance element VR is formed on the electrode EL1, and the electrode EL2 is formed on the variable-resistance element VR. The diode DI is formed on the electrode EL2, and the electrode EL3 is formed on the diode DI.

Examples of the material of the electrodes EL1 and EL2 are Pt, Au, Ag, TiAlN, SrRuO, Ru, RuN, Ir, Co, Ti, TiN, TaN, LaNiO, Al, PtIrO$_x$, PtRhO$_x$, Rh/TaAlN, and W. As the material of the electrode EL3, PtSi, Pd$_2$Si, or the like is used by taking the work function into consideration. The material of the electrodes EL1 and EL2 can be the same as that of the electrode EL3. It is also possible to insert a metal film that makes the orientation uniform. Furthermore, it is possible to additionally insert, e.g., a buffer layer, barrier metal layer, and adhesive layer.

[1-3] Variable-Resistance Element VR

The variable-resistance element VR is, e.g., a composite compound containing a cation that functions as a transition element. It is possible to use an element (ReRAM) that changes the resistance by the movement of the cation.

FIGS. 4 and 5 are views each showing examples of the high- and low-resistance states of the variable-resistance element VR.

In the variable-resistance element VR shown in FIG. 4, a recording layer 12 is formed between electrode layers 11 and 13. The recording layer 12 is made of a composite compound containing at least two kinds of cation elements. At least one of the cation elements is a transition element having a d orbit incompletely filled with electrons, and a shortest distance between adjacent cation elements is 0.32 nm or less.

More specifically, the variable-resistance element VR is made of a material represented by a formula $A_x M_y X_z$ (A and M are different elements), and having a crystal structure such as a spinel structure ($AM_2O_4$), ilmenite structure ($AMO_3$), delafossite structure ($AMO_2$), LiMoN$_2$ structure ($AMN_2$), wolframite structure ($AMO_4$), olivine structure ($A_2MO_4$), hollandite structure ($A_xMO_2$), ramsdellite structure ($A_xMO_2$), or perovskite structure ($AMO_3$).

In the example shown in FIG. 4, A is Zn, M is Mn, X is O, and ZnMn$_2$O$_4$ is used. The variable-resistance element VR may also be formed by using a thin film made of a material selected from, e.g., NiO, TiO$_2$, SrZrO$_3$, and Pr$_{0.7}$Ca$_{0.3}$MnO$_3$.

In the recording layer 12 shown in FIG. 4, a small white circle represents a diffused ion (Zn), a large white circuit represents an anion (O), and a small solid circle represents a transition element ion (Mn). The initial state of the recording layer 12 is the high-resistance state. When the electrode layer 11 is set at a fixed potential and a negative voltage is applied to the electrode layer 13, some diffused ions in the recording layer 12 move toward the electrode layer 13, so the diffused ions in the recording layer 12 relatively reduce with respect to the anions. The diffused ions having moved to the electrode layer 13 receive electrons from the electrode layer 13 and deposit as a metal, thereby forming a metal layer 14. In the recording layer 12, the anions become excessive and raise the valence of the transition element ions. Since this gives the recording layer 12 electron conductivity by carrier injection, the setting operation is complete. Data can be reproduced by supplying a very small current to such an extent that the material forming the recording layer 12 does not change the resistance.

The programmed state (low-resistance state) can be reset to the initial state (high-resistance state) by, e.g., Joule-heating the recording layer 12 by supplying a large current for a sufficient time, thereby accelerating the redox reaction of the recording layer 12. The resetting operation can also be performed by applying an electric field in a direction opposite to that of the setting operation.

In the example shown in FIG. 5, a recording layer 15 sandwiched between the electrode layers 11 and 13 is formed by two layers, i.e., a first compound layer 15a and second compound layer 15b. The first compound layer 15a is formed on the side of the electrode layer 11, and represented by a formula $A_xM1_yX1_z$. The second compound layer 15b is formed on the side of the electrode layer 13, and has a void site capable of accommodating a cation element of the first compound layer 15a.

In the first compound layer 15a of the example shown in FIG. 5, A is Mg, M1 is Mn, and X1 is O. The second compound layer 15b contains Ti indicated by a solid circle as a transition element ion. In the first compound layer 15a, a small white circle represents a diffused ion (Mg), a large white circle represents an anion (O), and a double circle represents a transition element ion (Mn). Note that the first compound layer 15a and second compound layer 15b may also be stacked to form two or more layers.

In the variable-resistance element VR, potentials are applied to the electrode layers 11 and 13 such that the first compound layer 15a is the anode and the second compound layer 15b is the cathode, thereby generating a potential gradient in the recording layer 15. Consequently, some diffused ions in the first compound layer 15a move in the crystal and enter the second compound layer 15b on the cathode side. Since the crystal of the second compound layer 15b has the void site capable of accommodating diffused ions, the diffused ions having moved from the first compound layer 15a are accommodated in this void site. This raises the valence of the transition element ions in the first compound layer 15a, and reduces the valence of the transition element ions in the second compound layer 15b. Assuming that the initial state of the first and second compound layers 15a and 15b is the high-resistance state, conduction carriers are generated in the crystals of the first and second compound layers 15a and 15b when some diffused ions in the first compound layer 15a move into the second compound layer 15b. This gives both the first and second compound layers 15a and 15b electrical conduction properties.

Note that as in the above-mentioned example, the programmed state (low-resistance state) can be reset to the erased state (high-resistance state) by Joule-heating the recording layer 15 by supplying a large current for a sufficient time, thereby accelerating the redox reaction in the recording layer 15. The resetting operation may also be performed by applying an electric field in a direction opposite to that of the setting operation.

As shown in FIG. 3, the diode DI is a PIN diode including a $p^{30}$-type layer D1, intrinsic layer (i layer) D2, and $n^+$-type layer D3. Although the i layer D2 is practically an $n^-$-type layer, it may also be a $p^-$-type layer. Signs "+" and "−" respectively indicate a high impurity concentration and low impurity concentration.

[1-4] Modification of Memory Cell Array

As shown in FIG. 6, the memory cell array may also have a three-dimensional structure in which a plurality of above-mentioned memory structures are stacked. FIG. 7 is a sectional view taken along line II-II' in FIG. 6. A modification shown in FIGS. 6 and 7 is a memory cell array having a four-layered structure including cell array layers MA0 to MA3. Memory cells MC0 and MC1 above and below a word line WL0j share it, memory cell MC1 and a memory cell MC2 above and below a bit line BL1i share it, and memory cell MC2 and a memory cell MC3 above and below a word line WL1j share it.

The memory cell array need not be the repetition of a line/cell/line/cell as described above, and it is also possible to insert an interlayer dielectric film between cell array layers so as to form a line/cell/line/interlayer dielectric film/line/cell/line. Note that the memory cell array 1 may also be divided into several memory cell groups MAT. The column controller 2 and row controller 3 can be formed for each memory cell group MAT, each sector, or each cell array layer MA, and can also be shared by them. The column controller 2 and row controller 3 can also be shared by a plurality of bit lines BL in order to reduce the area.

FIG. 8 is a circuit diagram of the memory cell array 1 and its peripheral circuit. To simplify the explanation, the explanation will be made by assuming that the memory cell array 1 has a single-layered structure.

Referring to FIG. 8, the anode of the diode DI forming the memory cell MC is connected to the word line WL, and the cathode of the diode DI is connected to the bit line BL via the variable-resistance element VR. One end of each bit line BL is connected to a selector 2a as a part of the column controller 2. One end of each word line WL is connected to a selector 3a as a part of the row controller 3.

The selector 2a includes PMOS select transistor QP0 and NMOS select transistor QN0 formed for each bit line BL and having a common gate and common drain. The source of PMOS select transistor QP0 is connected to a high-potential power supply Vcc. The source of NMOS select transistor QN0 is connected to a bit-line-side drive sense line BDS for applying a write pulse and supplying a current to be detected when reading out data. The common drain of transistors QP0 and QN0 is connected to the bit line BL. A bit-line select signal BSi for selecting each bit line BL is supplied to the common gate of transistors QP0 and QN0.

The selector 3a includes PMOS select transistor QP1 and NMOS select transistor QN1 formed for each word line WL and having a common gate and common drain. The source of PMOS select transistor QP1 is connected to a word-line-side drive sense line WDS for applying a write pulse and supplying a current to be detected when reading out data. The source of NMOS select transistor QN1 is connected to a low-potential power supply Vss. The common drain of transistors QP1 and QN1 is connected to the word line WL. A word-line select signal /WSi for selecting each word line WL is supplied to the common gate of transistors QP1 and QN1.

Note that the foregoing is an example suited to the selection of each individual memory cell. When simultaneously reading out data from a plurality of memory cells MC connected to a selected word line WL1, sense amplifiers are arranged in one-to-one correspondence with the bit lines BL0 to BL2, and the bit lines BL0 to BL2 are individually connected to the sense amplifiers via the selector 2a by a bit-line select signal BS. Note also that in the circuit shown in FIG. 8, a current may also be supplied from the bit line BL to the word line WL in the memory cell array 1 by inverting the polarity of the diode DI.

[1-5] Diode DI

The arrangement of the diode DI of the memory cell MC will be explained in detail below with reference to FIG. 9.

FIG. 9 is a sectional view showing the structure of the memory cell MC according to this embodiment. As described previously, the memory cell MC includes the diode DI, variable-resistance element VR, and metal electrodes EL1 to EL3 connected in series.

FIG. 10 is a sectional view showing the structure of the diode DI according to the embodiment. As shown in FIG. 10, the diode DI is a PIN diode including the $p^+$-type layer D1, i layer D2, and $n^+$-type layer D3. In this embodiment, the $n^+$-type layer D3 is made of a silicon-carbide mixture $Si_{1-x}C_x$ ($0<x<1$), and the $p^+$-type layer D1 and i layer D2 are made of silicon (Si). Since a lattice constant mismatch produces stress, x is desirably 0.15 to 0.5 in case the silicon-carbide mixture $Si_{1-x}C_x$ is a single crystal.

The silicon-carbide mixture $Si_{1-x}C_x$ may also be a polycrystal. Although the polycrystalline silicon-carbide mixture $Si_{1-x}C_x$ can be deposited at about 600° C., the single-crystal, silicon-carbide mixture $Si_{1-x}C_x$ must be deposited at about 1,100° C. Consequently, the use of the polycrystalline silicon-carbide mixture $Si_{1-x}C_x$ can suppress the variations in element characteristics, e.g., suppress an impurity diffusion layer. Note that since a lattice constant mismatch produces stress, x is desirably 0.15 to 0.5 in case the silicon-carbide mixture $Si_{1-x}C_x$ is a polycrystal.

An impurity to be doped in the $p^+$-type layer D1 is, e.g., boron (B). An impurity to be doped in the $n^+$-type layer D3 is, e.g., phosphorus (P) or arsenic (As). The i layer D2 is practically an $n^-$-type layer, and phosphorus (P), arsenic (As), or the like is diffused in the i layer D2. The impurity concentration of the $p^+$-type layer D1 is, e.g., $1 \times 20^{20}$ cm$^{-3}$, that of the $n^+$-type layer D3 is, e.g., $1 \times 20^{20}$ cm$^{-3}$, and that of the $n^-$-type layer (i layer D2) is, e.g., $1 \times 20^{17}$ cm$^{-3}$. Note that a PN diode including the $p^+$-type layer D1 and $n^+$-type layer D3 and having no i layer as shown in FIG. 11 may also be used as a modification of the diode DI.

Figure 12:
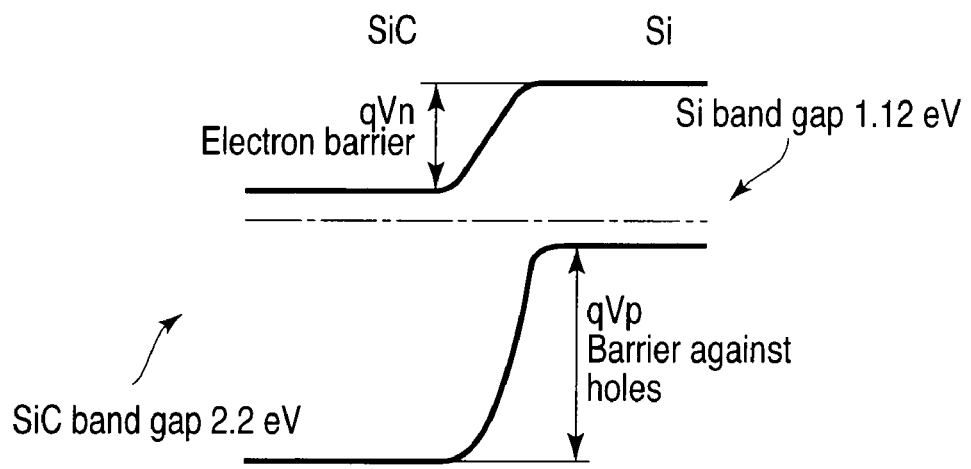
FIG. 12 is a view showing the state of the energy band of the diode according to the embodiment.

FIG. 12 is a view showing the energy band state of the diode DI according to the embodiment. FIG. 12 shows the energy band state of the diode DI including the $n^+$-type layer D3 and $p^+$-type layer D1. However, a diode including the $n^+$-type layer D3, i layer D2, and $p^+$-type layer D1 has almost the same energy band state.

The band gaps of the $n^+$-type layer D3 and $p^+$-type layer D1 are as shown in FIG. 12. As described previously, the $n^+$-type layer D3 is made of silicon carbide (SiC), and the $p^+$-type layer D1 is made of silicon (Si). As shown in FIG. 12, when the band gap of the $n^+$-type layer D3 is increased, the energy barrier against holes rises. As a consequence, components of recombination reduce, and the forward current of the diode increases.

Figure 13:
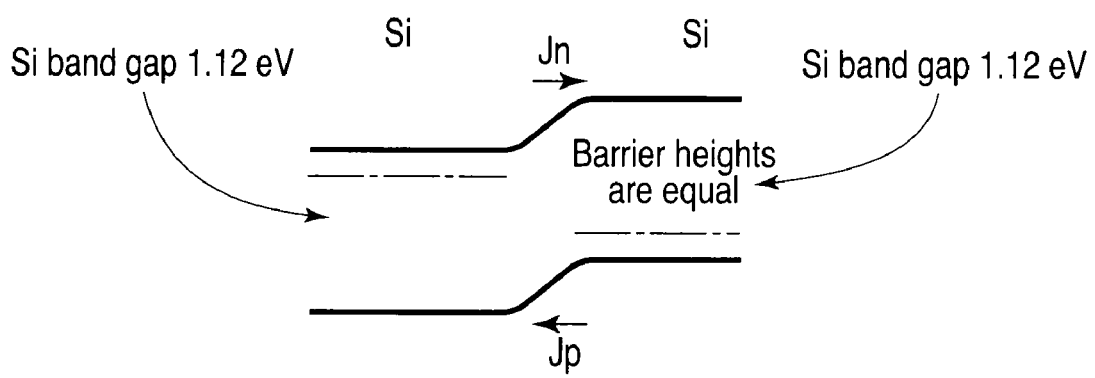
FIG. 13 is a view showing the state of the energy band of a diode according to a comparative example.

FIG. 13 shows the band gaps of a diode including an $n^+$-type layer and $p^+$-type layer made of silicon as a comparative example. As shown in FIG. 13, the energy barrier against holes is low in case the $n^+$-type layer and $p^+$-type layer are made of silicon. Consequently, components of recombination increase, and this suppresses the increase in forward current of the diode.

In case of using the diode DI of this embodiment, therefore, the forward current can be increased compared to a diode made of only silicon. For example, this embodiment can make the current four to five times that of a diode made of only silicon.

Also, the increase in leakage current in the reverse direction can be suppressed by forming the i layer D2 made of silicon (Si) between the $p^+$-type layer D1 and $n^+$-type layer D3. In a fine diode having a size of a few ten nm, band-to-band tunneling occurring via a depletion layer between p-n junctions occupies most of the reverse leakage current. The probability of this band-to-band tunneling increases as the forbidden bandwidth of a region where the depletion layer is formed decreases. In the diode of this embodiment, however, the whole i layer D2 (the $n^-$-type layer having a low impurity concentration) is a depletion layer, and the i layer D2 is made of silicon (Si), so the band-to-band tunneling probability dose not change from that of a diode entirely made of silicon. In the configuration of this embodiment, therefore, the reverse leakage current is not worse than that of the conventional structure.

In addition to the above-mentioned ability to reduce the leakage current when the reverse bias is applied, the i layer D2 has the effect of relaxing the stress produced by a lattice constant mismatch. That is, it is possible to suppress the occurrence of a lattice defect in the junction portion between the $p^+$-type layer D1 and $n^+$-type layer D3.

Furthermore, in case the metal electrode EL3 in contact with the $n^+$-type layer D3 made of SiC is made of PtSi or $Pd_2Si$, the Schottky barrier between the $n^+$-type layer (SiC) D3 and metal electrode EL3 can be decreased. Since this decreases the contact resistance between the $n^+$-type layer D3 and metal electrode EL3, the forward current of the diode DI can be increased.

In the junction interface between a semiconductor and metal, a Schottky barrier is sometimes formed owing to the difference between the work functions of the two materials. In the diode DI, a Schottky barrier is formed in the interface between the $p^+$-type layer D1 and electrode EL2, and in the interface between the $n^+$-type layer D3 and electrode EL3. In this embodiment, the material of the $n^+$-type layer D3 is $Si_{1-x}C_x$ ($0<x<1$). This makes it possible to reduce the height of the Schottky barrier formed in the interface, and increase the operation margin by decreasing the parasitic resistance. In this case, the work function $g\Phi s$ of $Si_{1-x}C_x$ forming the $n^+$-type layer D3 is made larger than the work function $g\Phi m$ of the metal forming the electrode EL3.

On the other hand, the material of the $p^+$-type layer D1 is preferably silicon (Si) rather than $Si_{1-x}C_x$ ($0<x<1$). Also, the material of the $p^+$-type layer D1 is preferably silicon (Si) rather than $Si_{1-x}Ge_x$ ($0<x<0.3$) as a narrow-band-gap material. This is so because a lattice defect may occur if $Si_{1-x}Ge_x$ ($0<x<0.3$) and $Si_{1-x}C_x$ ($0<x<1$) are junctioned.

Note that the parasitic resistance of the diode DI can be divided into the resistance of the semiconductor material forming the diode DI, and the resistance caused by the Schottky barrier in the interface between the diode DI and electrode.

The resistance of the semiconductor material can effectively be reduced by decreasing the film thickness of the diode DI in the direction of a current, particularly, the film thickness of the i layer D2. However, decreasing the film thickness of the i layer D2 increases the reverse leakage current. If the reverse leakage current increases, it occurs to problems of a setting error of an unselected memory cell in the setting operation, and the power consumption.

On the other hand, the resistance caused by the Schottky barrier in the interface can be reduced by decreasing the height and thickness of the Schottky barrier. The thickness of the Schottky barrier can be decreased by increasing the impurity concentrations of the p$^+$-type layer D1 and n$^+$-type layer D3. The height of the Schottky barrier is the difference between the work function of the materials of the metal electrodes in contact with the p$^+$-type layer D1 and n$^+$-type layer D3, and the work function of the materials of the p$^+$-type layer D1 and n$^+$-type layer D3. It is desirable to use materials that minimize the work function difference as the electrodes EL2 and EL3.

In the configuration of the diode DI disclosed in this embodiment as has been explained above, the forward current can be increased without worsening the reverse leakage current, compared to a diode made of only silicon. It is also possible to decrease the Schottky barrier between the n$^+$-type layer D3 and metal electrode EL3, and increase the forward current of the diode DI.

Note that in this embodiment, the same effect can be obtained by forming only a part of the n$^+$-type layer D3 which is in contact with the interface with the electrode EL3 by using $Si_{1-x}C_x$ ($0<x<1$), instead of forming the whole of the n$^+$-type layer D3 by using $Si_{1-x}C_x$.

The embodiment of the present invention can provide a semiconductor memory device capable of supplying a sufficient current to a memory cell.

The embodiment described above is not the only embodiment, and various embodiments can be formed by changing the above-mentioned configurations or adding various configurations. Furthermore, the embodiment described above includes inventions in various stages, so these inventions in the various stages can also be extracted by appropriately combining a plurality of constituent elements disclosed in the embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   first lines and second lines formed to intersect each other; and
   a memory cell array comprising memory cells arranged at intersections of the first lines and the second lines and each formed by connecting a rectification element and a variable-resistance element in series, the rectification element comprising a first semiconductor region having an n-type, a second semiconductor region having a p-type, and a third semiconductor region between the n-type first semiconductor region and the p-type second semiconductor region,
   wherein at least a portion of the first semiconductor region is made of a silicon-carbide mixture ($Si_{1-x}C_x$ ($0<x<1$)), and the second semiconductor region is made of silicon (Si), and
   the third semiconductor region has an impurity concentration lower than those of the first semiconductor region and the second semiconductor region.

2. The device according to claim 1, wherein x is 0.15 to 0.5 in the silicon-carbide mixture ($Si_{1-x}C_x$($0<x<1$) contained in the first semiconductor region.

3. The device according to claim 1, further comprising a metal electrode in contact with the first semiconductor region by a Schottky junction, the metal electrode including at least one of PtSi and $Pd_2Si$.

4. The device according to claim 1, further comprising a metal electrode in contact with the first semiconductor region by a Schottky junction, the work function q$\Phi$s of $Si_{1-x}C_x$ included the first semiconductor region being larger than the work function q$\Phi$m of a metal forming the metal electrode.

5. The device according to claim 1, wherein the rectification element comprises a PIN diode including the n-type first semiconductor region, the p-type second semiconductor region, and the third semiconductor region including an intrinsic semiconductor region.

6. The device according to claim 1, wherein the third semiconductor region includes an intrinsic semiconductor region, and the intrinsic semiconductor region is made of silicon (Si).

7. The device according to claim 1, wherein the third semiconductor region is made of silicon (Si) and is n-type.

8. The device according to claim 1, wherein the third semiconductor region is made of silicon (Si) and is p-type.

9. A semiconductor memory device comprising:
   first lines and second lines formed to intersect each other; and
   a memory cell array comprising memory cells arranged at intersections of the first lines and the second lines and each formed by connecting a rectification element and a variable-resistance element in series, the rectification element comprising a p-n diode including a first semiconductor region having an n-type and a second semiconductor region having a p-type, and the first semiconductor region contacting to the second semiconductor region,
   wherein at least a portion of the first semiconductor region is made of a silicon-carbide mixture ($Si_{1-x}C_x$($0<x<1$)), and the second semiconductor region is made of silicon (Si).

10. A semiconductor memory device comprising:
    first lines and second lines formed to intersect each other; and
    a memory cell array comprising memory cells arranged at intersections of the first lines and the second lines and each formed by connecting a rectification element and a variable-resistance element in series, the rectification element comprising a first semiconductor region having an n-type and a second semiconductor region having a p-type,
    wherein at least a portion of the first semiconductor region is made of a silicon-carbide mixture ($Si_{1-x}C_x$($0<x<1$)), and the second semiconductor region is made of silicon (Si), and the variable-resistance element is made of a composite compound containing a cation.

11. The device according to claim 1, wherein the variable-resistance element comprises a first electrode layer, a second electrode layer, and a recording layer formed between the first electrode layer and the second electrode layer, and the recording layer is made of a composite compound containing a cation.

* * * * *